(12) United States Patent
Takizawa et al.

(10) Patent No.: US 6,757,629 B2
(45) Date of Patent: Jun. 29, 2004

(54) CALIBRATION PLATE HAVING ACCURATELY DEFINED CALIBRATION PATTERN

(75) Inventors: Atsushi Takizawa, Kawasaki (JP); Kotaro Shirabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/906,676

(22) Filed: Jul. 18, 2001

(65) Prior Publication Data

US 2002/0082789 A1 Jun. 27, 2002

(30) Foreign Application Priority Data

Dec. 22, 2000 (JP) ........................................ 2000-391367

(51) Int. Cl.$^7$ ................................................ G06F 19/00
(52) U.S. Cl. .......................... 702/85; 702/94; 702/158
(58) Field of Search ............................... 356/614, 613, 356/616, 620, 243.4, 636; 430/5; 702/85, 94, 158

(56) References Cited

U.S. PATENT DOCUMENTS

| | | | | |
|---|---|---|---|---|
| 4,055,376 A | * | 10/1977 | Daberko ...................... | 33/700 |
| 4,377,340 A | * | 3/1983 | Green et al. ............ | 250/559.08 |
| 4,433,911 A | * | 2/1984 | Sawada et al. ............. | 355/125 |
| 5,902,703 A | * | 5/1999 | Leroux et al. .............. | 356/614 |
| 6,344,698 B2 | * | 2/2002 | Barr et al. ................... | 257/797 |

FOREIGN PATENT DOCUMENTS

| | | | | |
|---|---|---|---|---|
| JP | 404361547 | * | 12/1992 | .................. 430/30 |
| JP | 5-47634 | | 2/1993 | |

* cited by examiner

*Primary Examiner*—John Barlow
*Assistant Examiner*—Stephen J. Cherry
(74) *Attorney, Agent, or Firm*—Armstrong, Kratz, Quintos, Hanson & Brooks, LLP

(57) ABSTRACT

A calibration plate includes a first pattern in which bars and spaces are repeated, and a second pattern in which bars having an identical width to the spaces of the first pattern and spaces having an identical width to the bars of the first pattern are repeated, wherein the first pattern and the second pattern adjoin each other, and the bars and spaces of the first pattern and the bars and spaces of the second pattern are staggered.

3 Claims, 9 Drawing Sheets

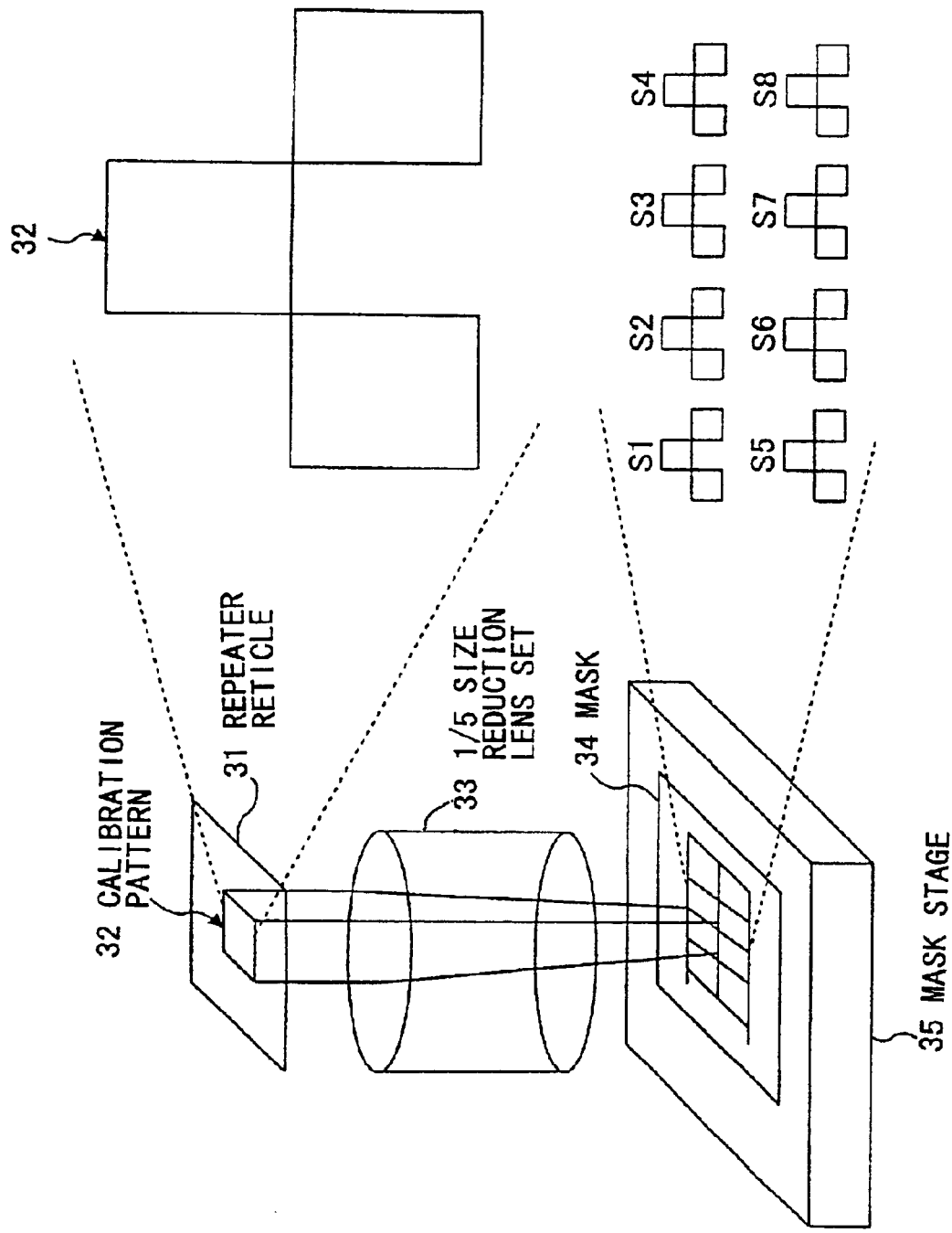

CALIBRATION PLATE HAVING ACCURATELY DEFINED CALIBRATION PATTERN

BACKGROUND OF THE INVENTION

1. Field of the Invention

The present invention generally relates to a calibration plate used in the manufacturing of semiconductor devices, and particularly relates to a calibration plate for circuit size measurement apparatuses.

2. Description of the Related Art

In the manufacturing of semiconductor devices, size measurement apparatuses are used to measure the width of circuit wires in semiconductor devices. As the circuit density of semiconductor devices increases as a result of technological development, the width of wires used in wiring patterns becomes increasingly narrower. In response, size measurement apparatuses need to be updated accordingly. When a new size measurement apparatus is installed, calibration needs to be made as to whether values measured by the newly installed size measurement apparatus are correct. A calibration pattern used for this purpose is required to be highly accurate.

Calibration plates are typically made by fabricating metal patterns of chrome, an oxide film, aluminum, or the like on glass substrates.

FIG. 1 is an illustrative drawing showing an example of a calibration plate. A pattern in which a bar (black) 10 and a space (white) 11 are repeated as shown in FIG. 1 is fabricated by metal such as chrome on a glass substrate. With respect to this metal pattern, a pitch P, a bar width B, and a space width S are defined by their physical sizes, which may be represented in micrometers, for example.

The calibration pattern on a calibration plate is made by patterning metal such as chrome on the glass substrate. The pitch P, the bar width B, and the space width S are defined by exposure data, which is the design data used for producing calibration patterns. However, the bar width B and the space width S are affected by processing conditions relating to exposure, development, etching, etc., at the time of producing an actual calibration pattern.

The pitch P is always equal to that specified by the exposure data despite variations of processing conditions. When a calibration pattern is used, however, the bar width B or the space width S is typically used, and the pitch P of its own is not used.

Accordingly, there is error in calibration patterns that are used for the purpose of calibrating size measurement apparatuses. The presence of error may not matter if the bar width B and the space width S are accurately measured, which is unfortunately not an easy task. In order to measure an actual pattern, an electron microscope or a coordinate measurement apparatus may be used. Each of an electron microscope and a coordinate measurement apparatus, however, may create undesirable value changes in the detected bar width B and the detected space width S depending on the way a slice level is set. The slice level is a threshold for slicing a pattern that is formed by detecting reflected electrons or the like.

Accordingly, a conventional calibration pattern offers an accurate pitch P, but provides the bar width B and the space width S for which accurate dimensions are unknown.

Accordingly, there is a need for a calibration plate that offers a bar width and a space width that are accurately defined.

SUMMARY OF THE INVENTION

It is a general object of the present invention to provide a calibration plate that substantially obviates one or more of the problems caused by the limitations and disadvantages of the related art.

It is another and more specific object of the present invention to provide a calibration plate that offers a bar width and a space width that are accurately defined.

In order to achieve the above objects according to the present invention, a calibration plate includes a first pattern in which bars and spaces are repeated, and a second pattern in which bars having an identical width to the spaces of the first pattern and spaces having an identical width to the bars of the first pattern are repeated, wherein said first pattern and said second pattern adjoin each other, and the bars and spaces of the first pattern and the bars and spaces of the second pattern are staggered.

In the calibration plate as described above, at least two lines of patterns are provided, each of which includes bars and spaces repeated therein, and the bars and the spaces in these lines are arranged such that the bars and the spaces are staggered across the line boundary, i.e., the bar positions of one of the lines corresponds to the space positions of the other one of the lines. With respect to the calibration pattern produced in such a fashion, an electron microscope or a coordinate measurement apparatus is used to check whether the edges of bars and spaces are aligned across the line boundary. This makes it possible to accurately identify the width of bars and spaces in addition to the pitch size.

According to another aspect of the present invention, the calibration pattern as described above is such that said first pattern and said second pattern are formed on a reticle or a wafer, which has a product pattern formed thereon, and is used for product manufacturing.

In the calibration plate as described above, the calibration pattern may be formed on product reticles or wafers that are actually used for manufacturing products, which makes it easier to calibrate a size measurement apparatus during the process steps of manufacturing actual products.

According to another aspect of the present invention, a method of producing a calibration plate includes the steps of providing exposure data of a calibration pattern including a first pattern in which bars and spaces are repeated, and a second pattern in which bars having an identical width to the spaces of the first pattern and spaces having an identical width to the bars of the first pattern are repeated, wherein said first pattern and said second pattern adjoin each other, and the bars and spaces of the first pattern and the bars and spaces of the second pattern are staggered, performing an exposure process multiple times by using the exposure data under different exposure conditions, and producing a calibration plate having a plurality of the calibration patterns formed thereon.

In the method described above, the exposure process using the exposure data is performed multiple times by changing exposure dosages or by changing the sizes of bars and spaces of the exposure data, thereby producing the calibration plate having the plurality of calibration patterns. With respect to the plurality of calibration patterns formed under different conditions, an electron microscope or a coordinate measurement apparatus is used to check whether edges of the bars and spaces are aligned. In this manner, a calibration pattern having aligned pattern edges is identified and selected from the plurality of calibration patterns, thereby providing a proper calibration pattern.

According to another aspect of the present invention, the method as described above is such that the producing the calibration plate includes the steps of producing a reticle plate having a plurality of calibration patterns formed thereon, and performing an exposure process by using the reticle plate as a mask to produce the calibration plate having a calibration pattern that is reduced in size compared with the calibration patterns formed on the reticle.

In the method as described above, the reticle having the calibration pattern is produced first, and, then, a size reduced image of the calibration pattern is projected and copied onto the calibration plate by use of a repeater, a stepper, or the like. In this manner, the pattern is formed on the repeater reticle by using relatively large physical dimensions, and, then, this pattern is reduced in size to form the actual calibration plate. This makes it possible to produce a calibration pattern having higher precision.

According to another aspect of the present invention, a method of producing a semiconductor device includes the steps of producing a calibration plate including a first pattern in which bars and spaces are repeated, and a second pattern in which bars having an identical width to the spaces of the first pattern and spaces having an identical width to the bars of the first pattern are repeated, wherein said first pattern and said second pattern adjoin each other, and the bars and spaces of the first pattern and the bars and spaces of the second pattern are staggered, calibrating a size measurement apparatus by using the calibration plate, and measuring the semiconductor device by using the calibrated size measurement apparatus.

In the method as described above, the size measurement apparatus is calibrated by use of a highly accurate calibration plate, thereby making it possible to produce a semiconductor device through a highly precise manufacturing process.

Other objects and further features of the present invention will be apparent from the following detailed description when read in conjunction with the accompanying drawings.

BRIEF DESCRIPTION OF THE DRAWINGS

FIG. 7 is an illustrative drawing showing the way the calibration pattern is projected and transferred onto a mask by using a photo repeater;

DESCRIPTION OF THE PREFERRED EMBODIMENTS

In the following, embodiments of the present invention will be described with reference to the accompanying drawings.

Figure 1:
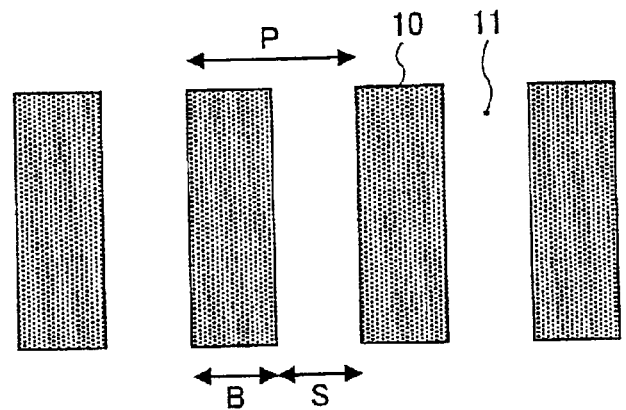
FIG. 1 is an illustrative drawing showing an example of a related-art calibration plate.
Figure 2:
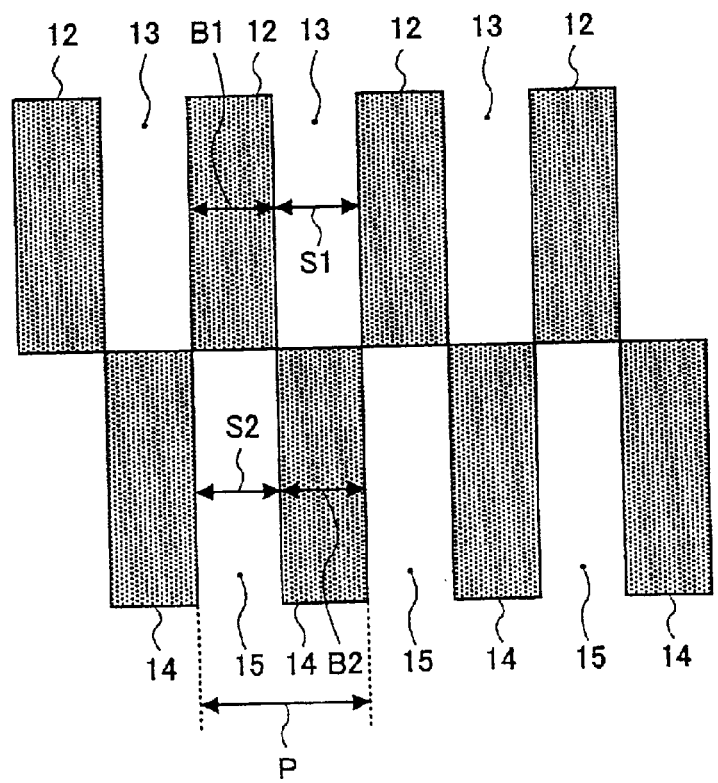
FIG. 2 is an illustrative drawing showing an embodiment of a calibration pattern according to the present invention.

FIG. 2 is an illustrative drawing showing an embodiment of a calibration pattern according to the present invention.

As shown in FIG. 2, the calibration pattern of the present invention includes a pattern in which a bar 12 and a space 13 (an area between adjacent bars 12) are repeated, and such a pattern is fabricated by metal such as chrome on a glass substrate or the like. Further, a pattern in which a bar 14 and a space 15 (an area between adjacent bars 14) are repeated is fabricated on the same substrate. The pattern of the bars 12 and the spaces 13 and the pattern of the bars 14 and the spaces 15 are staggered, such that the bar 12 spatially corresponds to the space 15, and the bar 14 spatially corresponds to the space 13. Further, the calibration pattern is designed such that the width of the bar 12 is the same as the width of the space 15, and the width of the space 13 is equal to the width of the bar 14.

With respect to the calibration pattern designed and produced as described above, an electron microscope or a coordinate measurement apparatus is used to check whether the edges of the bar 12 are in line with the edges of the bar 14. If the edge are found to be aligned, the sizes of the bar 12, the space 13, the bar 14, and the space 15 are accurately known. For the sake of explanation, it is assumed that the pitch P is 0.5 $\mu$m according to the design data, with the width of the bar 12 and the width of the space 13 being 1:1 in terms of their ratio. Since it is checked that the edges are aligned, a width B1 of the bar 12 is equal to a width S2 of the space 15. Further, processing conditions relating to exposure, development, etching, etc., are believed to be identical in areas adjacent to each other on the same substrate, so that the width B1 of the bar 12 is equal to a width B2 of the bar 14. Thus, B1 is equal to S2, and B1 is equal to B2. This entails that B2 is equal to S2. Accordingly, the width of the bar 14 and the width of the space 15 are half the pitch P (0.5 $\mu$m), and are thus 0.25 $\mu$m. By the same token, the width of the bar 12 and the width of the space 13 are half the pitch P (0.5 $\mu$m), and are thus 0.25 $\mu$m. In general, the width of bars and spaces in a calibration pattern ranges from 0.2 $\mu$m to 1.0 $\mu$m.

In this manner, the calibration pattern according to the present invention includes at least two columns of patterns, each of which includes bars and spaces repeated therein, and the bars and the spaces in these columns are arranged such that the bars and the spaces are staggered across the column boundary, i.e., the bar positions of one of the columns corresponds to the space positions of the other one of the columns. With respect to the calibration pattern produced in such a rule, an electron microscope or a coordinate measurement apparatus is used to check whether the edges of bars and spaces are aligned across the column boundary. This makes it possible to identify the width of bars and spaces in addition to the pitch size.

A calibration plate having the calibration pattern of the present invention is not necessarily made with a glass substrate and a metal pattern formed thereon, but may be made with a wafer or a reticle and a calibration pattern formed thereon. The term "calibration plate" in this specification is not intended to limit its material, but is intended to cover a structure in general having a calibration pattern.

Figure 3A:
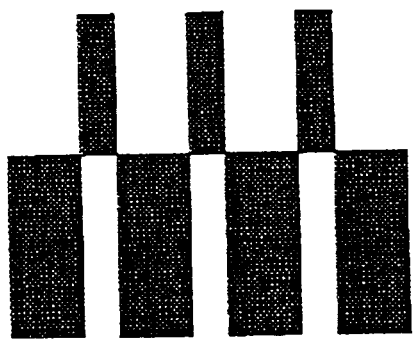
FIGS. 3A and 3B are illustrative drawing showing variations of the calibration pattern according to the present invention.
Figure 3B:
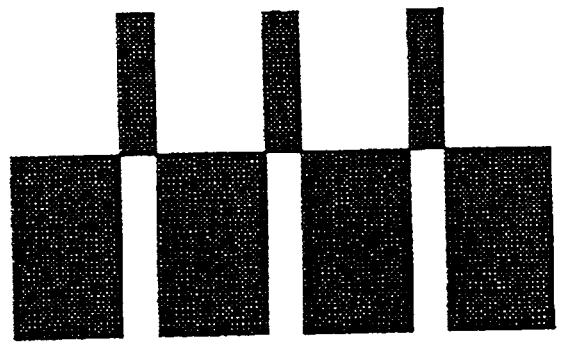

FIGS. 3A and 3B are illustrative drawing showing variations of the calibration pattern according to the present invention.

The pattern of FIG. 3A is formed in the same fashion as that of FIG. 2. In the pattern of FIG. 3A, the bar and the space on the upper side have respective widths in the ratio of 1 to 2, and the bar and the space on the lower side have a width ratio of 2 to 1. In the pattern of FIG. 3B, the bar and the space on the upper side has a width ratio of 1 to 3, and the bar and the space on the lower side have a width ratio of 3 to 1.

In this manner, even if the bar and the space are not provided with a 1:1 width ratio, the widths of the bar and the space can be known by using an electron microscope or a coordinate measurement apparatus and checking whether the edges of the bars and spaces are aligned across the boundary of adjacent patterns. Namely, in the pattern of FIG. 3B, for example, it can be ascertained that the bar and the space on the upper side have widths ¼P and ¾P with respect to the pitch P, respectively.

Figure 4:
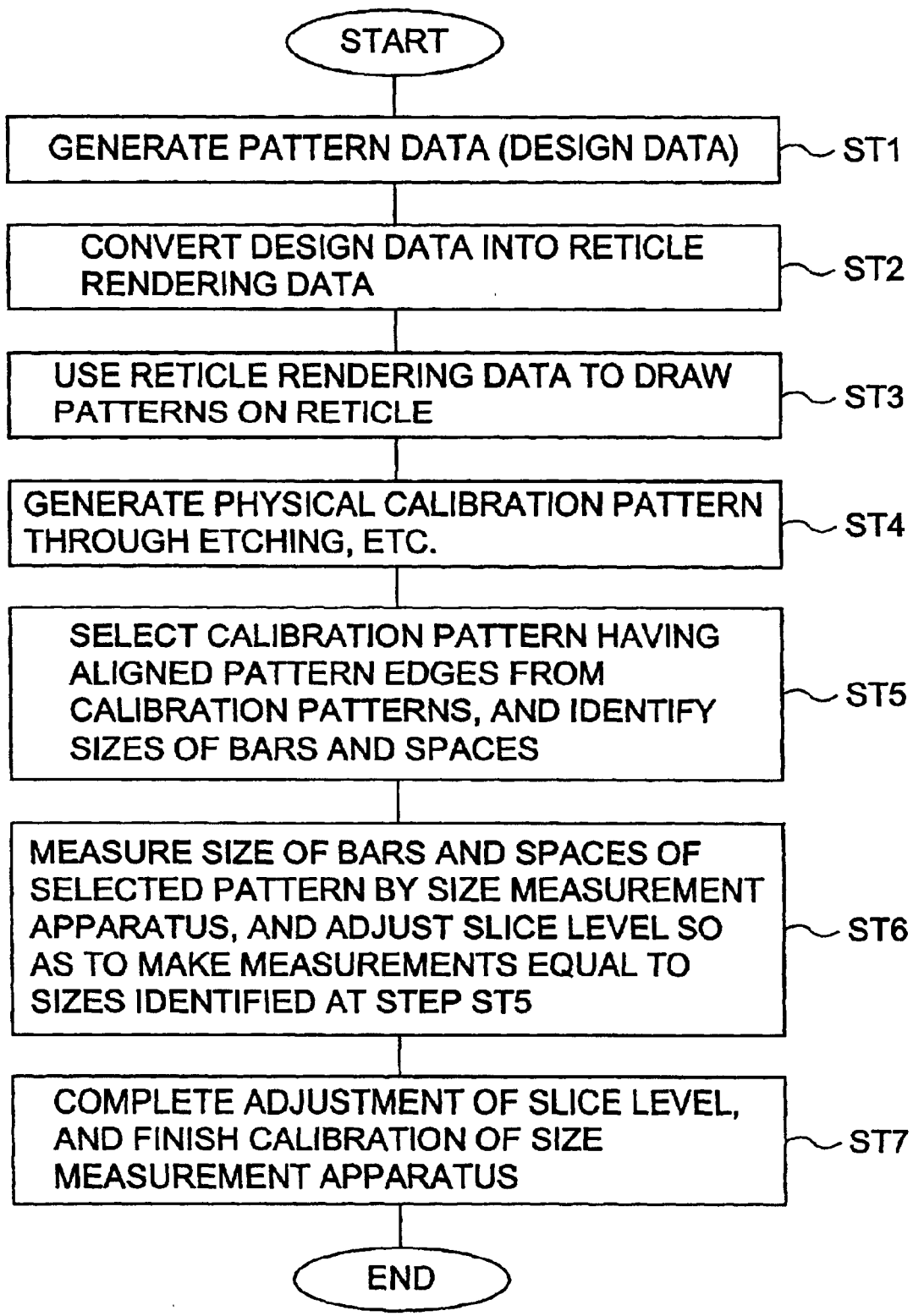
FIG. 4 is a flowchart showing a first embodiment of a method of calibrating a size measurement apparatus by using a calibration pattern according to the present invention.

FIG. 4 is a flowchart showing a first embodiment of a method of calibrating a size measurement apparatus by using a calibration pattern according to the present invention.

At step ST1, pattern data (design data) of a calibration pattern is generated. The pattern data of the calibration pattern represents the pattern as shown in FIG. 2, for example.

At step ST2, the design data is converted into reticle exposure data.

At step ST3, the reticle exposure data is used to draw patterns on a reticle. The same exposure data is repeatedly used by changing exposure dosages to draw a plurality of calibration patterns on the same reticle.

At step ST4, development, etching, resist removal, and cleansing are carried out to produce a calibration pattern (calibration plate) as the reticle.

At step ST5, the calibration reticle is mounted on a scanning electron microscope (SEM) for observation purposes or a scanning electron microscope (SEM) for measurement purposes, and a calibration pattern having straight pattern edges is selected from the plurality of calibration patterns generated for different exposure dosages.

Figure 5:
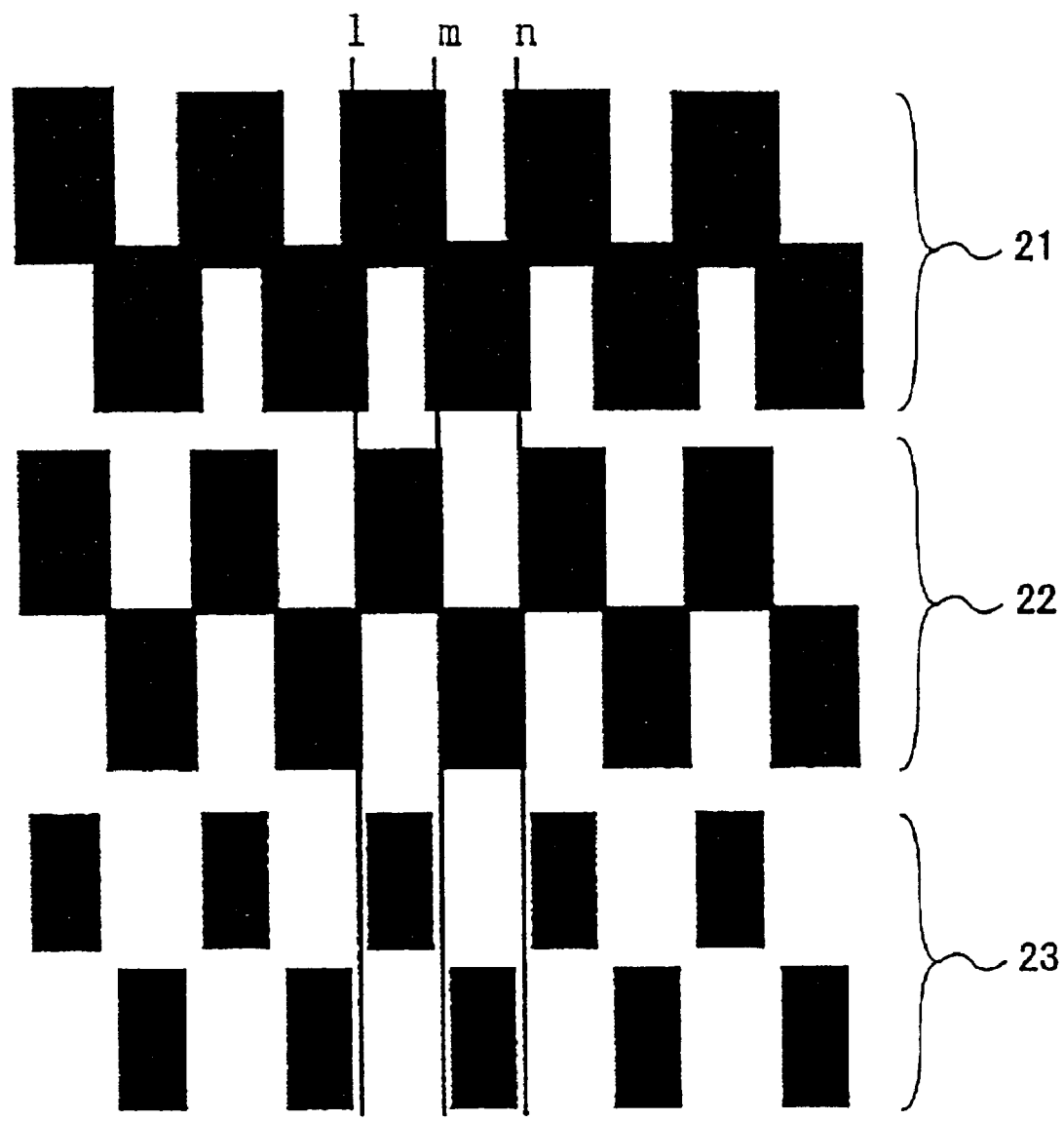
FIG. 5 is an illustrative drawing showing a plurality of calibration patterns generated by repeatedly using the same design data with changes of exposure dosages.

FIG. 5 is an illustrative drawing showing a plurality of calibration patterns generated by repeatedly using the same design data with changes of exposure dosages.

As shown in FIG. 5, a first set 21 of bars and spaces is formed on the reticle by using a first exposure dosage, and a second set 22 of bars and spaces is formed on the same reticle by using a second exposure dosage. A third set 23 of bars and spaces is formed on the same reticle by using a third exposure dosage. In the example shown in FIG. 5, the first exposure dosage results in over-dosage, so that the bars and spaces of the first set 21 do not have edges that are aligned to straight lines 1, m, and n. The third exposure dosage goes too much to the side of under-dosage, resulting in the edges of bars and spaces of the third set 23 being not aligned to the straight lines 1, m, and n. The second exposure dosage is proper, and the edges of bars and spaces of the second set 22 are aligned to the straight lines. Based on this observation, it is learned that the second pattern is most appropriate as a calibration pattern among the first through third calibration patterns.

When the design data is generated by setting a ratio of the bar to the space equal to 1:1, the size of the bar and the space will be half the designed pitch size in the selected proper calibration pattern. In this manner, the size of the bar and the space is properly and correctly identified.

At step ST6 of FIG. 4, the calibration reticle is mounted in the size measurement apparatus for measuring device patterns, and the size of bars and spaces of the selected pattern is measured by the size measurement apparatus. The obtained measurement values are then compared with the sizes that are identified at step ST5. If they are not equal, the slice level of the size measurement apparatus is adjusted, and the measurement values are taken again. The adjustment of the slice level is repeated as many times as necessary until the same measurement values are obtained.

At step ST7, the adjustment of the slice level is completed, which finishes the calibration of the size measurement apparatus.

Figure 6:
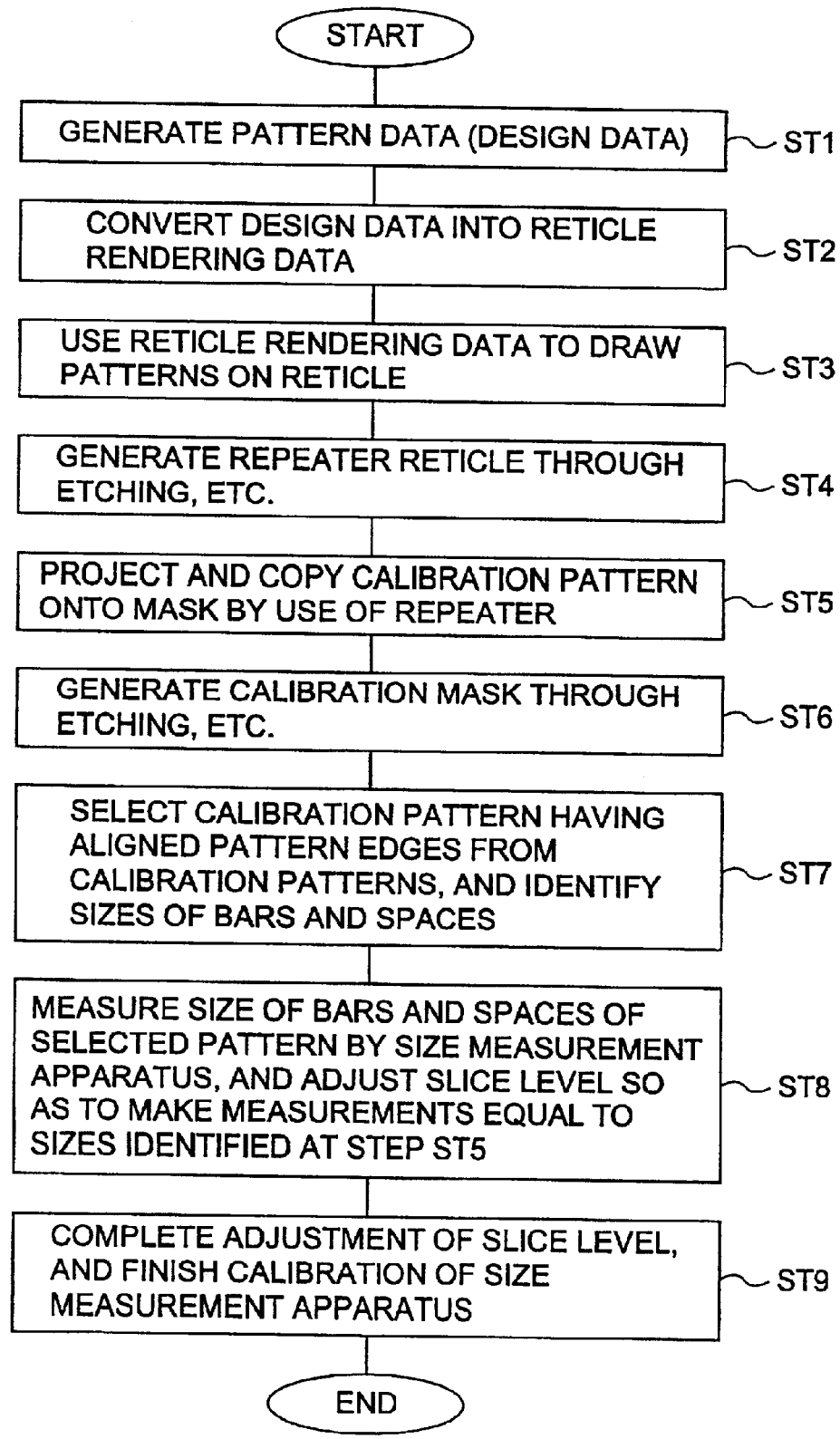
FIG. 6 is a flowchart showing a second embodiment of a method of calibrating a size measurement apparatus by using a calibration pattern according to the present invention.

FIG. 6 is a flowchart showing a second embodiment of a method of calibrating a size measurement apparatus by using a calibration pattern according to the present invention.

In this second embodiment, a photo repeater having the function of ⅕ reduction is employed so as to generate a more accurate calibration pattern.

At step ST1, pattern data (design data) of a calibration pattern is generated. The pattern data of the calibration pattern represents the pattern as shown in FIG. 2, for example.

At step ST2, the design data is converted into reticle exposure data.

At step ST3, the reticle exposure data is used to draw a pattern on a reticle. The conditions for exposure and the like are set properly in advance in the same manner as in the first embodiment.

At step ST4, development, etching, resist removal, and cleansing are carried out to produce a reticle for the photo repeater.

At step ST5, the reticle for the photo repeater is mounted in the photo repeater, and the calibration pattern is projected and transferred onto the mask. Exposure dosages are changed while a step and repeat exposure are performed so as to generate a plurality of calibration patterns on the same mask.

FIG. 7 is an illustrative drawing showing the way the calibration pattern is projected and transferred onto the mask by using the photo repeater.

A repeater reticle 31 having a calibration pattern 32 formed thereon is mounted in the photo repeater. An image of the calibration pattern 32 of the reticle 31 is projected onto a mask 34 with ⅕ reduction through a ⅕ size reduction lens set 33. The mask 34 is mounted on a mask stage 35. Through this operation, exposure dosages are changed to carry out a step and repeat exposure, thereby producing a plurality of calibration patterns S1 through S8 on the mask 34. Among the calibration patterns S1 through S8, a pattern with a proper exposure dosage will have aligned pattern edges.

At step ST6 of FIG. 6, development, etching, resist removal, and cleansing are carried out to produce a calibration mask having a calibration pattern formed thereon.

At step ST7, the calibration mask is mounted on a scanning electron microscope (SEM) for observation purposes or a scanning electron microscope (SEM) for measurement purposes, and a calibration pattern having straight pattern edges is selected from the plurality of calibration patterns generated for different exposure dosages. Then, the width of the bar and the space is identified.

At step ST8, the calibration mask is mounted in the size measurement apparatus for measuring device patterns, and the size of bars and spaces of the selected calibration pattern is measured by the size measurement apparatus. The obtained measurement values are then compared with the sizes that are identified at step ST7. If they are not equal, the slice level of the size measurement apparatus is adjusted, and the measurement values are taken again. The adjustment of the slice level is repeated as many times as necessary until the same measurement values are obtained.

At step ST9, the adjustment of the slice level is completed, which finishes the calibration of the size measurement apparatus.

In the manner as described above, a repeater reticle having a calibration pattern is produced first, and, then, a size reduced image of the calibration pattern is projected and transferred onto a mask. In this manner, a pattern is formed on the repeater reticle by using relatively large physical dimensions, and, then, this pattern is reduced in size to form an actual calibration mask. This makes it possible to produce a calibration pattern having higher precision. In detail, when a calibration pattern is produced on a reticle or a mask, edges of the pattern may be jagged because of the shape of an electron beam slit used in the electron beam exposure or the shape of a laser beam spot used in the laser beam exposure. If the reticle produced in this manner is mounted in the photo repeater and a calibration pattern is formed on a blank plate, however, jaggedness of the edges are reduced through the size reduction of the pattern, thereby producing edges that are closer to straight lines.

Instead of mounting a reticle in a photo repeater and producing a mask, the reticle may be mounted in a stepper, and a calibration pattern may be formed on a glass wafer. Use of equivalent configurations or use of configurations that are known to be replaceable equivalents are intended to be within the scope of the present invention.

Figures 8A, 8B, 8C:
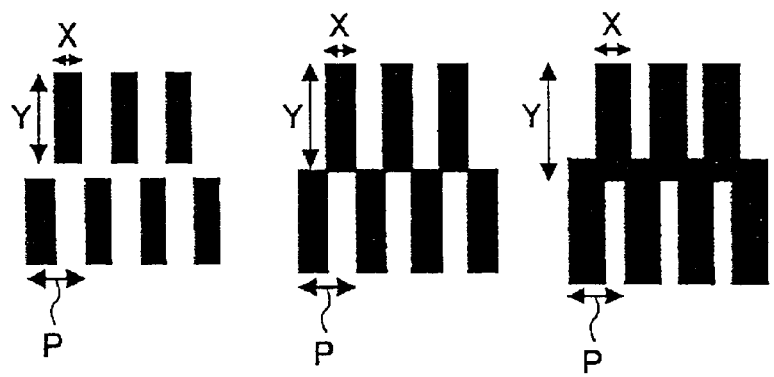
FIGS. 8A through 8C are illustrative drawings showing the design data of calibration patterns having different bar sizes.

FIGS. 8A through 8C are illustrative drawings showing the design data of calibration patterns having different bar sizes.

As was described in connection with FIG. 5, a plurality of calibration patterns are drawn by using the same exposure data repeatedly while changing exposure dosages, and a proper calibration pattern is identified that has aligned pattern edges. By the same token, a plurality of different types of design data may be prepared for the purpose of forming a proper calibration pattern having physically aligned pattern edges.

FIGS. 8A through 8C show different types of design data, which have varying bar size X and Y for a constant pitch P. When a plurality of patterns having varying proportions between the bar and the space are prepared in this manner, at least one of the calibration patterns actually produced through exposure probably turns out to be a proper calibration pattern having aligned pattern edges. If the exposure process is performed under the conditions of slight over-dosage, for example, the pattern of FIG. 8A among the patterns of FIGS. 8A through 8C may turn out to be a proper calibration pattern.

Figure 9:
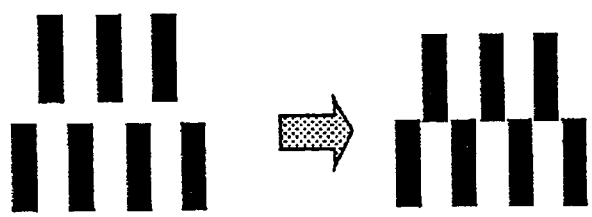
FIG. 9 is an illustrative drawing showing a variation of the pattern of FIG. 8A.

FIG. 9 is an illustrative drawing showing a variation of the pattern of FIG. 8A.

The pattern of FIG. 8A has a gap between the bars of the upper side and the bars of the lower side. Because of this, a check may not be able to be made as to whether pattern edges are aligned when observed by an electron microscope or a coordinate measurement apparatus. In consideration of this, a pattern of FIG. 9 has the upper side pattern or the lower side pattern shifted in the vertical direction so as to have no gap between the upper side pattern and the lower side pattern.

Figure 10:
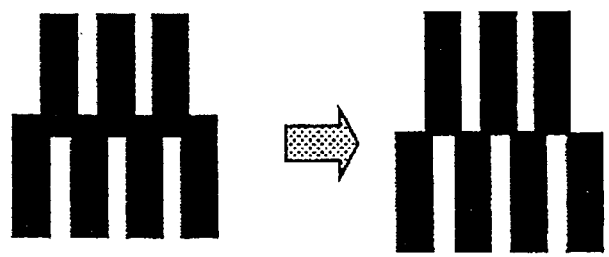
FIG. 10 is an illustrative drawing showing a variation of the pattern of FIG. 8C.

FIG. 10 is an illustrative drawing showing a variation of the pattern of FIG. 8C.

The pattern of FIG. 8C has the bars of the upper side and the bars of the lower side that are so close as to overlap. Because of this, a check may not be able to be made as to whether pattern edges are aligned when observed by an electron microscope or a coordinate measurement apparatus. In consideration of this, a pattern of FIG. 10 has the upper side pattern or the lower side pattern shifted in the vertical direction so as to have a just touching connection between the upper side pattern and the lower side pattern.

Figures 11A, 11B, 11C:
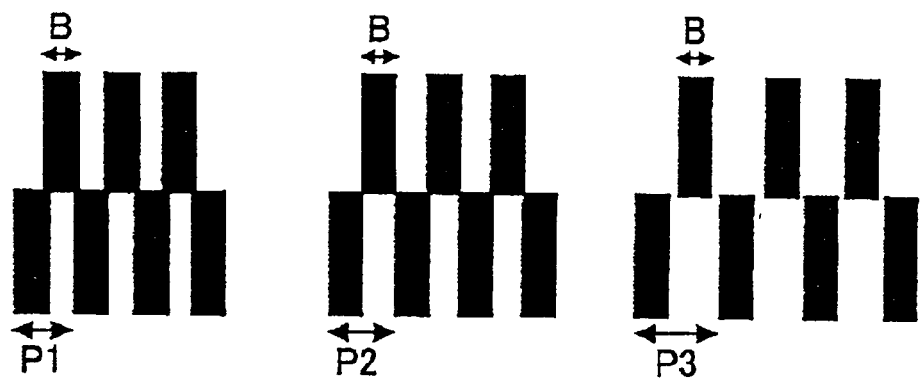
FIGS. 11A through 11C are illustrative drawings showing patterns having varying pitches for a constant bar size.

FIGS. 11A through 11C are illustrative drawings showing patterns having varying pitches for a constant bar size.

In FIGS. 8A through 8C, the bar size X and Y are changed while keeping the pitch P constant. As shown in FIGS. 11A through 11C, on the other hand, the bar size B may be kept constant, and the pitch P may be changed. As was the case in the previous examples, at least one of the calibration patterns actually produced through exposure probably turns out to be a proper calibration pattern having aligned pattern edges.

Figure 12:
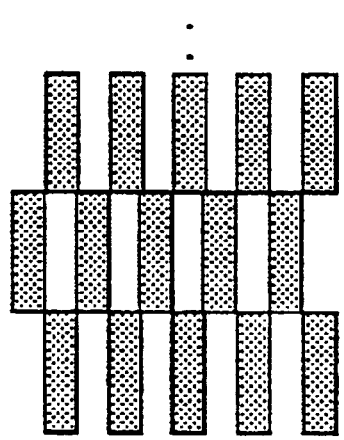
FIG. 12 is an illustrative drawing showing a variation of a calibration pattern according to the present invention.

FIG. 12 is an illustrative drawing showing a variation of a calibration pattern according to the present invention.

The calibration pattern of FIG. 12 includes more than two lines of patterns in which bars and spaces are repeated. When only two lines of bars and spaces are formed as shown in FIG. 2, upper tips of the bars 12 on the upper side and lower tips of the bars 14 on the lower side may taper, depending on process conditions. If this happens, it would be difficult to check whether pattern edges are aligned. Also, the bar size may differ depending on the portion of the bar, which results in a defective calibration pattern.

In the calibration pattern having a plurality of lines as shown in FIG. 12, on the other hand, a middle line will have a constant bar width even if the bars of the upper line and the bars of the lower line end up having tapering tips. This insures a proper calibration pattern.

Figure 13:
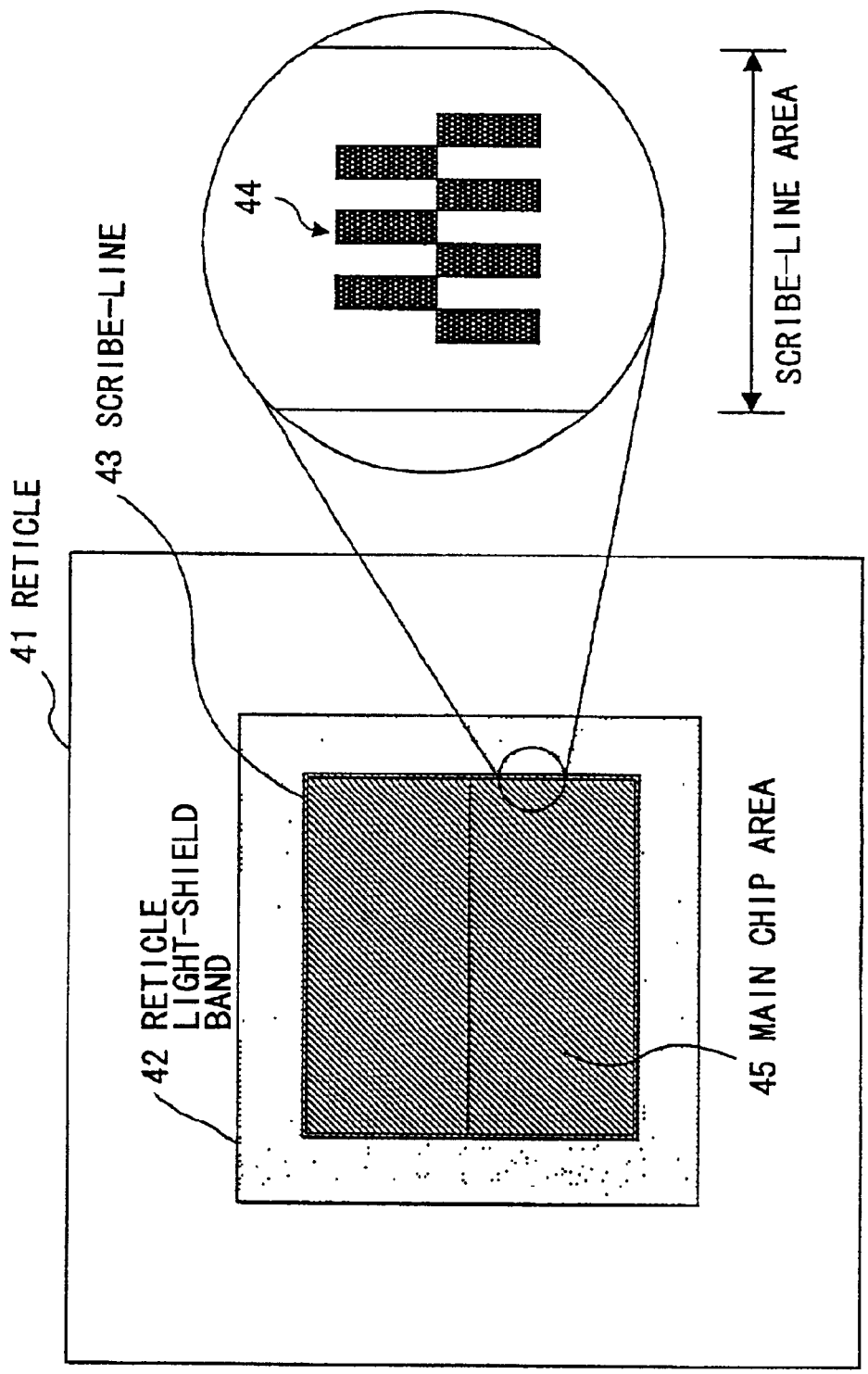
FIG. 13 is an illustrative drawing showing a product reticle that corresponds to an actually produced semiconductor device.

FIG. 13 is an illustrative drawing showing a product reticle that corresponds to an actually produced semiconductor device.

A product reticle 41 includes a reticle light-shield band 42, a scribe-line area 43, and a main chip area 45. A calibration pattern 44 of the present invention may be formed in the scribe-line area 43. The area where the calibration pattern 44 is formed is not limited to the scribe-line area 43, but may be formed in an unused space if such an unused space is available.

In this manner, a calibration pattern may be formed on product reticles that are actually used for manufacturing products. This makes it easier to calibrate a size measurement apparatus during the process steps of manufacturing actual products.

By the same token, the product reticle having the calibration pattern formed thereon may be used to form a calibration pattern on product wafers. The calibration pattern formed on the product wafers makes it easier to calibrate a size measurement apparatus during the process steps of manufacturing actual products.

Further, the present invention is not limited to these embodiments, but various variations and modifications may be made without departing from the scope of the present invention.

The present application is based on Japanese priority application No. 2000-391367 filed on Dec. 22, 2000, with the Japanese Patent Office, the entire contents of which are hereby incorporated by reference.

What is claimed is:

1. A method of producing a calibration plate, comprising the steps of:

providing exposure data of a calibration pattern including a first pattern in which first bars and spaces are repeated, and a second pattern in which second bars having an identical width to the spaces of the first pattern and spaces having an identical width to the first bars of the first pattern are repeated, wherein said first pattern and said second pattern adjoin each other, wherein the first bars adjoin the spaces of the second pattern and the second bars adjoin the spaces of the first pattern; and wherein an edge of each of the first bars is aligned with a respective edge of one of the second bars;

performing an exposure process multiple times by changing exposure dosages while using the same exposure data; and producing a calibration plate having a plurality of calibration patterns formed thereon that correspond to respective exposures of said exposure process performed multiple times.

2. The method as claimed in claim 1, wherein the step of producing the calibration plate includes the steps of:

producing a reticle plate having a plurality of calibration patterns formed thereon; and performing an exposure process by using the reticle plate as a mask to produce the calibration plate having a calibration pattern that is reduced in size compared with the calibration patterns formed on the reticle.

3. A method of producing a semiconductor device, comprising the steps of:

providing exposure data of a calibration pattern including a first pattern in which first bars and spaces are repeated, and a second pattern in which second bars having an identical width to the spaces of the first pattern and spaces having an identical width to the first bars of the first pattern are repeated, wherein said first pattern and said second pattern adjoin each other, wherein the first bars adjoin the spaces of the second pattern and the second bars adjoin the spaces of the first pattern, and wherein an edge of each of the first bars is aligned with a respective edge of one of the second bars;

performing an exposure process multiple times by changing exposure dosages while using the same exposure data;

producing a calibration plate having a plurality of calibration patterns formed thereon that correspond to respective exposures of said exposure process performed multiple times;

calibrating a size measurement apparatus by using one of the calibration patterns that has edges of the bars and spaces aligned between the first pattern and the second pattern; and measuring a semiconductor to be the semiconductor device by using the calibrated size measurement apparatus.

* * * * *